(12) United States Patent
Baek et al.

(10) Patent No.: US 9,755,657 B2
(45) Date of Patent: Sep. 5, 2017

(54) SUCCESSIVE APPROXIMATION REGISTER ANALOG-TO-DIGITAL CONVERTER AND SEMICONDUCTOR DEVICE INCLUDING THE SAME

(71) Applicant: SAMSUNG ELECTRONICS CO., LTD., Suwon-si (KR)

(72) Inventors: Seung Yeob Baek, Daejeon (KR); Eun Seok Shin, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/241,262

(22) Filed: Aug. 19, 2016

(65) Prior Publication Data

US 2017/0093418 A1 Mar. 30, 2017

(30) Foreign Application Priority Data

Sep. 24, 2015 (KR) .......................... 10-2015-0135483

(51) Int. Cl.
*H03M 1/38* (2006.01)
*H03M 1/12* (2006.01)
*H03M 1/46* (2006.01)
*H03M 1/06* (2006.01)
*H03M 1/00* (2006.01)

(52) U.S. Cl.
CPC ........... *H03M 1/124* (2013.01); *H03M 1/466* (2013.01); *H03M 1/00* (2013.01); *H03M 1/0695* (2013.01); *H03M 1/12* (2013.01)

(58) Field of Classification Search
CPC ......... H03M 1/0695; H03M 1/12; H03M 1/00
USPC ................. 341/161, 155, 120, 156, 163, 118
See application file for complete search history.

(56) References Cited

U.S. PATENT DOCUMENTS

| 5,815,043 | A | 9/1998 | Chow et al. |
| 8,659,462 | B2 | 2/2014 | Kang |
| 8,786,483 | B1* | 7/2014 | Thompson .......... H03M 1/0836 341/120 |
| 8,928,515 | B1 | 1/2015 | Hu et al. |
| 8,957,802 | B1 | 2/2015 | Evans |
| 2008/0252507 | A1 | 10/2008 | Gerfers et al. |
| 2008/0258824 | A1 | 10/2008 | Goff |
| 2012/0280846 | A1* | 11/2012 | Lin ...................... H03M 1/002 341/172 |
| 2013/0106630 | A1 | 5/2013 | Wong et al. |
| 2014/0022105 | A1 | 1/2014 | Chen et al. |
| 2014/0043175 | A1 | 2/2014 | Fogleman et al. |

(Continued)

FOREIGN PATENT DOCUMENTS

| CN | 104242934 A | 12/2014 |
| CN | 104348485 A | 2/2015 |
| EP | 0372548 A2 | 6/1990 |

(Continued)

*Primary Examiner* — Joseph Lauture
(74) *Attorney, Agent, or Firm* — Sughrue Mion, PLLC

(57) ABSTRACT

A successive approximation register (SAR) analog-to-digital converter (ADC) includes a ring oscillator configured to determine a frequency based on a sampling clock signal and a first control code, and generate an output clock signal having the determined frequency. The SAR ADC further includes a controller configured to generate the first control code based on a count value indicating a number of times of toggling the output clock signal.

17 Claims, 6 Drawing Sheets

(56) References Cited

U.S. PATENT DOCUMENTS

2015/0042500 A1   2/2015  Fujiwara et al.

FOREIGN PATENT DOCUMENTS

EP          1583242  A1   10/2005
KR        101341029  B1   12/2013

* cited by examiner

SUCCESSIVE APPROXIMATION REGISTER ANALOG-TO-DIGITAL CONVERTER AND SEMICONDUCTOR DEVICE INCLUDING THE SAME

CROSS-REFERENCE TO RELATED APPLICATION

This application claims priority from Korean Patent Application No. 10-2015-0135483 filed on Sep. 24, 2015, in the Korean Intellectual Property Office, the disclosure of which is herein incorporated by reference in its entirety.

BACKGROUND

1. Field

Apparatuses and methods consistent with example embodiments relate to an electronic circuit, and more particularly, to an asynchronous successive approximation register (SAR) analog-to-digital converter (ADC) and a semiconductor device including the same.

2. Description of the Related Art

An ADC is a device that converts an analog signal into a digital signal. A SAR ADC includes a SAR and compares a digital code including a plurality of bits with an analog signal while sequentially increasing or decreasing the digital code starting from an upper bit to approximate the digital signal to the analog signal. An asynchronous SAR ADC operates according to an internal operating clock signal generated in an ADC based on an externally input sampling clock signal, and is different from a synchronous SAR ADC receiving an externally input operating clock signal.

Because an asynchronous SAR ADC uses an internal clock signal, metastability may occur when a reference voltage is compared with an input voltage in a comparator. When a ring oscillator is designed to overcome the metastability of the asynchronous SAR ADC, an operating frequency may increase or decrease due to process, voltage and temperature (PVT), which deteriorates linearity.

SUMMARY

According to example embodiments, a successive approximation register (SAR) analog-to-digital converter (ADC) includes a ring oscillator configured to determine a frequency based on a sampling clock signal and a first control code, and generate an output clock signal having the determined frequency. The SAR ADC further includes a controller configured to generate the first control code based on a count value indicating a number of times of toggling the output clock signal.

The controller may include a code generator configured to generate a second control code based on the count value, and a switch control register configured to store the second control code, and output, to the ring oscillator, the first control code corresponding to the second control code.

The code generator may be further configured to determine whether the count value is greater than a reference count value, generate the second control code for controlling the frequency to be decreased, in response to the code generator determining that the count value is greater than the reference count value, and generate the second control code for controlling the frequency to be increased, in response to the code generator determining that the count value is less than the reference count value.

The ring oscillator may include an output clock signal generation circuit configured to generate the output clock signal based on the sampling clock signal and a feedback clock signal, a feedback circuit configured to generate the feedback clock signal, and a delay adjustment circuit configured to adjust a delay of the output clock signal based on the first control code, and output the delay-adjusted output clock signal to the feedback circuit.

The delay adjustment circuit may include a decoder configured to decode the first control code to generate a decoded control code, and a delay circuit configured to generate delayed clock signals having different delays based on the output clock signal, and output one among the delayed clock signals as the delay-adjusted output clock signal based on the decoded control code.

The delay circuit may include one among an inverter chain, a current controlled delay line, and a current starved delay line.

The ring oscillator may further include an output circuit configured to generate a first clock signal and a second clock signal having different delays, based on the output clock signal.

The SAR ADC may further include a digital-to-analog converter configured to sample an input voltage, generate a first reference voltage based on the sampled input voltage and voltages that are determined based on respective bits included in a reference voltage control code, and generate an analog output voltage based on the first reference voltage and the sampled input voltage, an amplifier configured to amplify the analog output voltage based on the first clock signal, a comparator configured to compare an output voltage of the amplifier with a second reference voltage based on the second clock signal, and generate a comparison signal based on the comparison, and a SAR logic circuit configured to generate the reference voltage control code based on a timing information signal, and output the comparison signal.

The SAR ADC may further include a digital logic circuit configured to determine which one among the bits included in the reference voltage control code is to be processed based on the count value, and generate the timing information signal based on the determination.

The SAR ADC may further include a counter configured to count the number of times of toggling the output clock signal in a period to generate the count value.

According to example embodiments, a semiconductor device includes a signal generator configured to generate an input voltage, a successive approximation register (SAR) analog-to-digital converter (ADC) configured to convert the input voltage into a digital output signal based on a sampling clock signal, and a digital signal processing circuit configured to process the digital output signal. The SAR ADC includes a ring oscillator configured to determine a frequency based on a sampling clock signal and a first control code, and generate an output clock signal having the determined frequency, and a controller configured to generate the first control code based on the frequency of the output clock signal.

The controller may include a code generator configured to generate a second control code based on the count value, and a switch control register configured to store the second control code, and output, to the ring oscillator, the first control code corresponding to the second control code.

The code generator may be further configured to determine whether the count value is greater than a reference count value, generate the second control code for controlling the frequency to be decreased, in response to the code generator determining that the count value is greater than the reference count value, and generate the second control code for controlling the frequency to be increased, in response to the code generator determining that the count value is less than the reference count value.

The ring oscillator may include an output clock signal generation circuit configured to generate the output clock signal based on the sampling clock signal and a feedback clock signal, a feedback circuit configured to generate the feedback clock signal, and a delay adjustment circuit configured to adjust a delay of the output clock signal based on the first control code, and output the delay-adjusted output clock signal to the feedback circuit.

The delay adjustment circuit may include a decoder configured to decode the first control code to generate a decoded control code, and a delay circuit configured to generate delayed clock signals having different delays based on the output clock signal, and output one among the delayed clock signals as the delay-adjusted output clock signal based on the decoded control code.

A number of bits included in the first control code may be less than a number of bits included in the decoded control code.

According to example embodiments, a successive approximation register (SAR) analog-to-digital converter (ADC) includes a ring oscillator configured to generate an output clock signal based on a sampling clock signal, a counter configured to counts a number of times of toggling the output clock signal in a period to generate a count value, and a controller configured to generate a control code for controlling a frequency of the output clock signal based on the count value. The ring oscillator is further configured to generate the output clock signal having the controlled frequency based on the control code.

The controller may be further configured to determine whether the count value is equal to a reference count value, generate the second control code for controlling the frequency to be maintained, in response to the code generator determining that the count value is equal to the reference count value, generate the second control code for controlling the frequency to be decreased, in response to the code generator determining that the count value is greater than the reference count value, and generate the second control code for controlling the frequency to be increased, in response to the code generator determining that the count value is less than the reference count value.

The number of times of toggling the output clock signal may be equal to a number of rising or falling edges of the output clock signal in a the period.

The SAR ADC may further include a digital-to-analog converter configured to sample an input voltage, generate a first reference voltage based on the sampled input voltage and voltages that are determined based on respective bits included in a reference voltage control code, and generate an analog output voltage based on the first reference voltage and the sampled input voltage, an amplifier configured to amplify the analog output voltage based on a first clock signal, the ring oscillator being further configured to determine the first clock signal based on the output clock signal, a comparator configured to compare an output voltage of the amplifier with a second reference voltage based on the second clock signal, and generate a comparison signal based on the comparison, the ring oscillator being further configured to determine the second clock signal having a delay different than a delay of the first clock signal, based on the output clock signal, and a SAR logic circuit configured to generate the reference voltage control code based on a timing information signal, and output the comparison signal.

BRIEF DESCRIPTION OF THE DRAWINGS

The above and/or other aspects will be more apparent by describing example embodiments with reference to the accompanying drawings.

DETAILED DESCRIPTION

Figure 1:
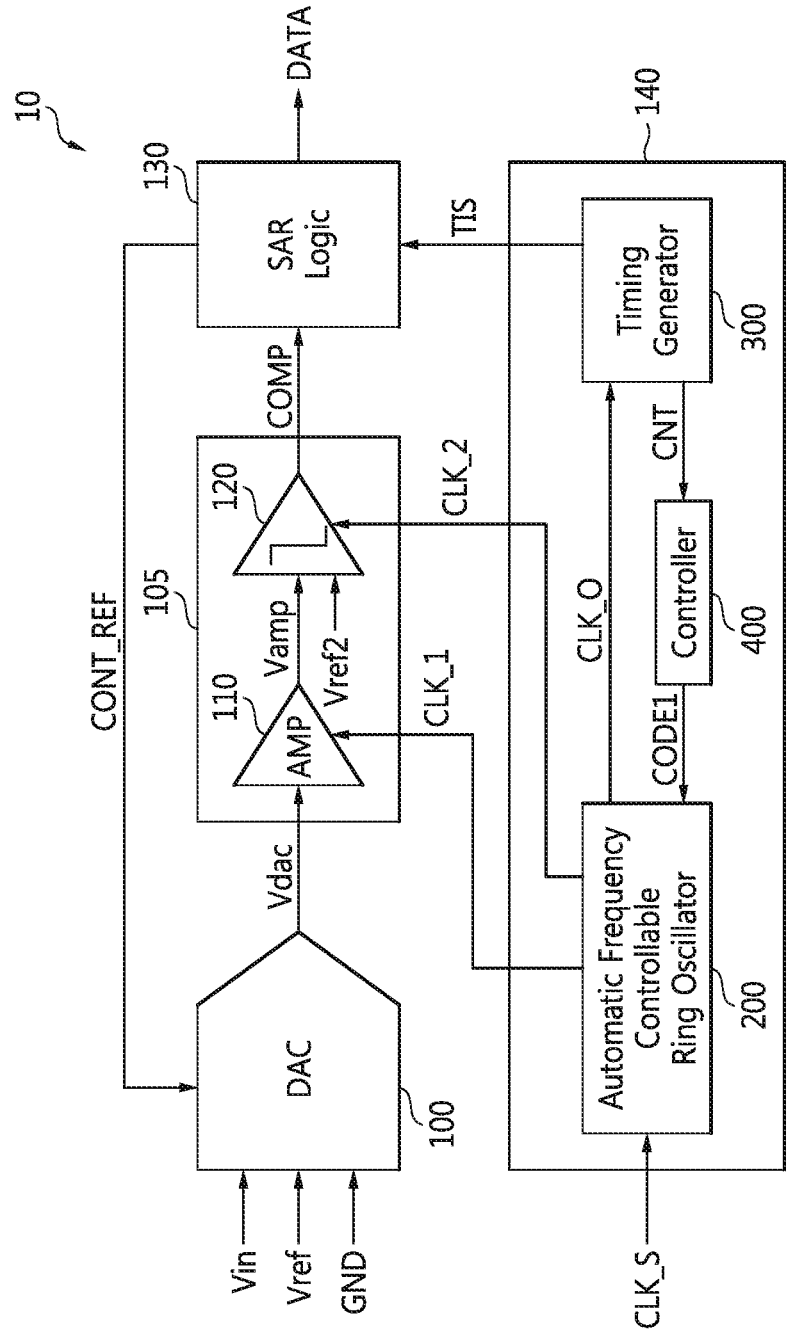
FIG. 1 is a block diagram illustrating a successive approximation register (SAR) analog-to-digital converter (ADC) according to example embodiments.

Example embodiments now will be described more fully hereinafter with reference to the accompanying drawings. The example embodiments may, however, be embodied in many different forms and may not be construed as limited to the example embodiments set forth herein. Rather, these example embodiments are provided so that this disclosure will be thorough and complete, and will fully convey the scope of the example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/."

It will be understood that, although the terms first, second, etc. may be used herein to describe various elements, these elements may not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing the example embodiments only and is not intended to be limiting of the example embodiments. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, may be interpreted as having a meaning that is consistent with their meaning in the context of the relevant art and/or the present application, and will not be interpreted in an idealized or overly formal sense unless expressly so defined herein.

FIG. 1 is a block diagram illustrating a successive approximation register (SAR) analog-to-digital converter (ADC) 10 according to example embodiments. The SAR ADC 10 includes a digital-to-analog converter (DAC) 100, a comparator circuit 105, a SAR logic circuit 130, and an internal clock system 140.

The DAC 100 receives an input voltage Vin, a reference voltage Vref, and a ground voltage GND, and may sample the input voltage Vin during a sampling period. The DAC 100 may generate a first reference voltage according to a plurality of bits included in a reference voltage control code CONT_REF, and generates an analog output voltage Vdac using a sampled input voltage. The DAC 100 may include a plurality of capacitors (or resistors) and a plurality of switches. The first nodes (or the first electrodes) of the respective capacitors are connected with one another. The second nodes (or the second electrodes) of the respective capacitors are connected in series with the switches, respectively.

The reference voltage control code CONT_REF includes a plurality of bits. The bits control the switching operation of the switches, respectively. Each of the switches may be connected to the input voltage Vin, the reference voltage Vref, or the ground voltage GND according to the level of a corresponding one among the bits. The level of an internal voltage of the DAC 100, i.e., the level of the first reference voltage, may be adjusted according to the switching operation.

The DAC 100 may perform an operation on the input voltage Vin and the first reference voltage, and generates the analog output voltage Vdac. The operation may be addition or subtraction but is not restricted to these examples.

For instance, when the sign of the input voltage Vin is the same as that of the first reference voltage, the analog output voltage Vdac may be calculated using Equation 1:

$$Vdac=Vin-Vref1, \quad (1)$$

where Vref1 is the first reference voltage.

When the sign of the input voltage Vin is different from that of the first reference voltage, the analog output voltage Vdac may be calculated using Equation 2:

$$Vdac=Vin+Vref1. \quad (2)$$

The comparator circuit 105 includes an amplifier 110 and a comparator 120. The comparator circuit 105 amplifies the analog output voltage Vdac, compares an amplified analog output voltage with a second reference voltage Vref2, and outputs a comparison signal COMP corresponding to a comparison result. The second reference voltage Vref2 may be the ground voltage GND but is not restricted thereto. The second reference voltage Vref2 may be a direct current (DC) voltage other than the ground voltage GND.

The amplifier 110 amplifies the analog output voltage Vdac output from the DAC 100, and outputs an amplified voltage Vamp according to a first clock signal CLK_1. The amplifier 110 may operate in response to either a rising edge or a falling edge of the first clock signal CLK_1. The amplified voltage Vamp of the amplifier 110 may be defined as Equation 3:

$$Vamp=A*Vdac, \quad (3)$$

where A is gain of the amplifier 110. The amplifier 110 may be a differential amplifier, a non-inverting amplifier, or an inverting amplifier but is not restricted thereto.

Although the comparator circuit 105 includes the amplifier 110 in the example embodiments illustrated in FIG. 1, the example embodiments are not restricted thereto. The comparator circuit 105 may not include the amplifier 110 in other example embodiments. In this case, the analog output voltage Vdac output from the DAC 100 may be transmitted to the comparator 120 without being amplified. The comparator 120 may compare the analog output voltage Vdac with the second reference voltage Vref2 in response to a second clock signal CLK_2, and may output the comparison signal COMP; and a ring oscillator 200 may not output the first clock signal CLK_1, but may output only the second clock signal CLK_2 to the comparator 120.

The comparator 120 compares the amplified voltage Vamp with the second reference voltage Vref2, and outputs the comparison signal COMP in response to the second clock signal CLK_2. When the amplified voltage Vamp is greater than or equal to the second reference voltage Vref2, the comparator 120 may output the comparison signal COMP at a high level (or a low level in other example embodiments). When the amplified voltage Vamp is less than the second reference voltage Vref2, the comparator 120 may output the comparison signal COMP at a low level (or a high level in other example embodiments).

When the amplified voltage Vamp is equal or close to the second reference voltage Vref2, the comparator 120 may remain in a reset state for a period of time, which may be referred to as a metastable state. When the comparator 120 is in the metastable state, the SAR ADC 10 may continuously perform or terminate analog-to-digital conversion according to example embodiments.

The comparator 120 may operate in response to either a rising edge or a falling edge of the second clock signal CLK_2. The phase of the second clock signal CLK_2 lags behind the phase of the first clock signal CLK_1.

The SAR logic circuit 130 may determine which of the bits included in the reference voltage control code CONT_REF is processed in response to a timing information signal TIS output from a timing generator 300. The SAR logic circuit 130 transmits the reference voltage control code CONT_REF that have been determined according to the timing information signal TIS and the comparison signal COMP, to the DAC 100.

The SAR logic circuit 130 may include memory. The memory may sequentially store the comparison signal COMP output at each loop of analog-to-digital conversion. The SAR logic circuit 130 outputs the comparison signal COMP as a digital output signal DATA when the analog-to-digital conversion ends.

When the level of the comparison signal COMP is high (or logic 1), for instance, when the an input voltage sampled by the DAC 100 is greater than the first reference voltage, the SAR logic circuit 130 may generate the reference voltage control code CONT_REF so that a voltage higher than the first reference voltage becomes a first reference voltage at the next loop. When the level of the comparison signal COMP is low (or logic 0), for instance, when the an input voltage sampled by the DAC 100 is less than the first reference voltage, the SAR logic circuit 130 may generate the reference voltage control code CONT_REF so that a voltage lower than the first reference voltage becomes a first reference voltage at the next loop.

The internal clock system 140 generates the clock signals CLK_1 and CLK_2 used in the SAR ADC 10 and the timing information signal TIS for the operation of the SAR ADC 10, using a sampling clock signal CLK_S. The internal clock system 140 outputs the first clock signal CLK_1 to the amplifier 110, outputs the second clock signal CLK_2 to the comparator 120, and outputs the timing information signal TIS to the SAR logic circuit 130. The internal clock system 140 includes the ring oscillator 200, the timing generator 300, and a controller 400. The internal clock system 140 may be an internal clock signal generator.

The ring oscillator 200 generates the first clock signal CLK_1, the second clock signal CLK_2, and an output clock signal CLK_O using the sampling clock signal CLK_S and a control code CODE. The ring oscillator 200 outputs the first clock signal CLK_1 to the amplifier 110, outputs the second clock signal CLK_2 to the comparator 120, and outputs the output clock signal CLK_O to the timing generator 300.

The ring oscillator 200 does not operate in response to a signal output from the comparator 120. Accordingly, even when the comparator 120 is in the metastable state, the ring oscillator 200 may generate the output clock signal CLK_O regardless of the state of the comparator 120. Therefore, the SAR ADC 10 may continuously perform analog-to-digital conversion.

The timing generator 300 receives the output clock signal CLK_O from the ring oscillator 200, generates a count value CNT by counting the number of times of toggling of the output clock signal CLK_O during a conversion period of the sampling clock signal CLK_S, and outputs the count value CNT to the controller 400. The timing generator 300 also generates the timing information signal TIS indicating which of the bits included in the reference voltage control code CONT_REF is to be processed, based on the count value CNT, and outputs the timing information signal TIS to the SAR logic circuit 130 to control the operation of the SAR logic circuit 130.

The controller 400 receives the count value CNT from the timing generator 300, may compare the count value CNT with a reference count value, may determine whether a frequency of the output clock signal CLK_O is appropriate for the operation of the SAR ADC 10 based on a comparison result, and outputs a first control code CODE1 for controlling the frequency (or cycle) of the output clock signal CLK_O according to a determination result. The first control code CODE1 may include a plurality of bits.

The reference count value may correspond to the number of clocks for the SAR ADC 10 to properly perform analog-to-digital conversion. The reference count value may be predetermined, but the example embodiments are not restricted thereto. The reference count value may be set when a system including the SAR ADC 10 is formed or may be variable according to the operation of the system in other example embodiments.

Figure 2:
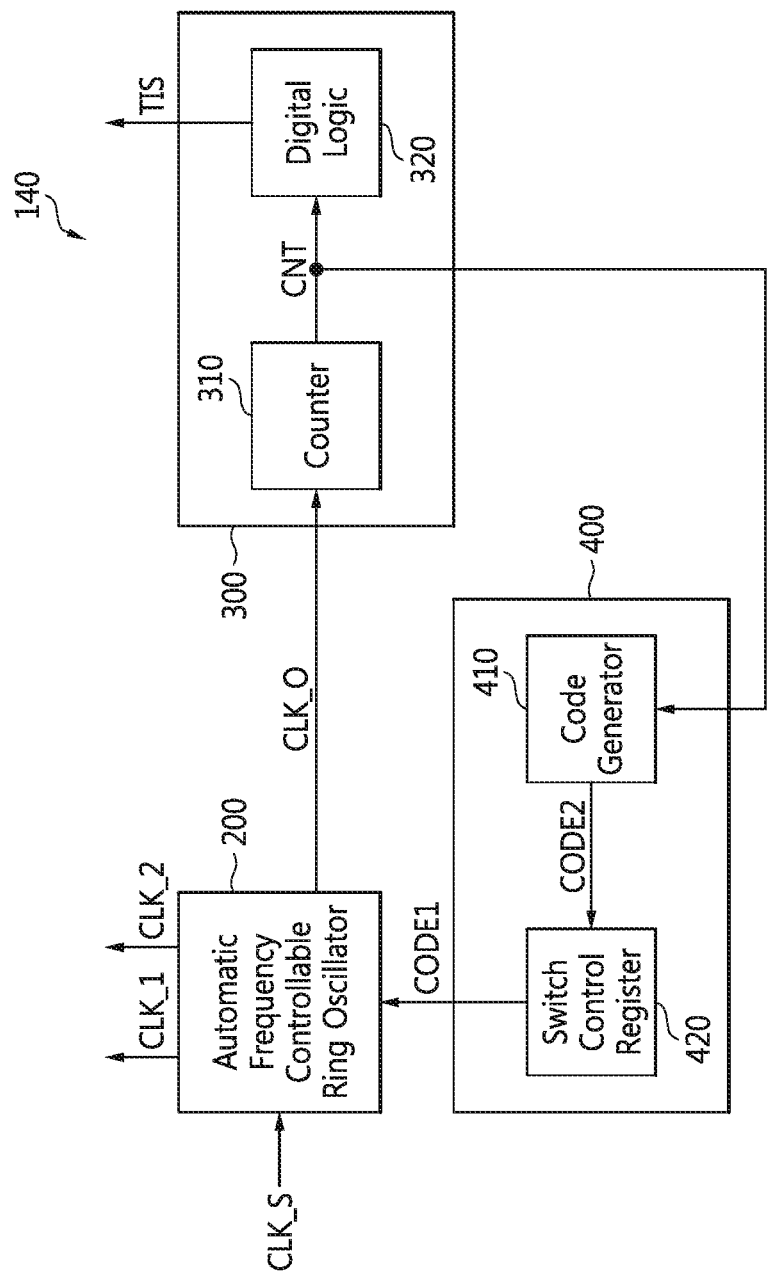
FIG. 2 is a detailed block diagram illustrating an internal clock system illustrated in FIG. 1.

FIG. 2 is a detailed block diagram illustrating the internal clock system 140 illustrated in FIG. 1. Referring to FIGS. 1 and 2, the internal clock system 140 includes the ring oscillator 200, the timing generator 300, and the controller 400. The structure and operations of the ring oscillator 200 will be described in detail with reference to FIG. 3. The timing generator 300 includes a counter 310 and a digital logic circuit 320.

The counter 310 generates the count value CNT related to the output clock signal CLK_O during a conversion period of the sampling clock signal CLK_S. The counter 310 transmits the count value CNT to the digital logic circuit 320 and a code generator 410 included in the controller 400. The count value CNT may indicate the number of rising or falling edges of the output clock signal CLK_O in a predetermined period. The number of rising or falling edges may indicate the number of output bits of the SAR ADC 10. For instance, when the SAR ADC 10 is a 10-bit SAR ADC and the number of rising or falling edges is a decimal digit 6, it refers to the sixth bit being converted.

The digital logic circuit 320 may determine which of the bits included in the reference voltage control code CONT_REF is processed based on the count value CNT, and generates the timing information signal TIS according to a determination result. The SAR logic circuit 130 may convert one among bits in the reference voltage control code CONT_REF in response to the level of the comparison signal COMP, and the timing information signal TIS may indicate a bit to be converted. For instance, when the count value CNT is a decimal digit 6 in the 10-bit SAR ADC 10, the timing information signal TIS may include information indicating that the sixth bit among ten bits is to be converted.

The timing generator 300 is included in the internal clock system 140 in the example embodiments illustrated in FIG. 2. However, the timing generator 300 may be included in the SAR logic circuit 130 in other example embodiments.

The controller 400 includes the code generator 410 and a switch control register 420. The code generator 410 receives the count value CNT, and generates a second control code CODE2 for determining a frequency of the ring oscillator 200 based on the count value CNT.

For instance, when the count value CNT is less than the reference count value, the code generator 410 may generate the second control code CODE2 instructing to increase the frequency of the output clock signal CLK_O, and outputs the second control code CODE2 to the switch control register 420. When the count value CNT is greater than the reference count value, the code generator 410 may generate the second control code CODE2 instructing to decrease the frequency of the output clock signal CLK_O, and outputs the second control code CODE2 to the switch control register 420. When the count value CNT is the same as the reference count value, the code generator 410 may generate the second control code CODE2 instructing to maintain the frequency of the output clock signal CLK_O, and outputs the second control code CODE2 to the switch control register 420.

The code generator 410 may generate the second control code CODE2 when each conversion of a sampled input voltage ends. In other example embodiments, the code generator 410 may generate the second control code CODE2 when at least two times of conversion end.

The switch control register 420 receives the second control code CODE2 from the code generator 410, may store the second control code CODE2, and outputs the first control code CODE1 corresponding to the second control code CODE2 to the ring oscillator 200.

Figure 3:
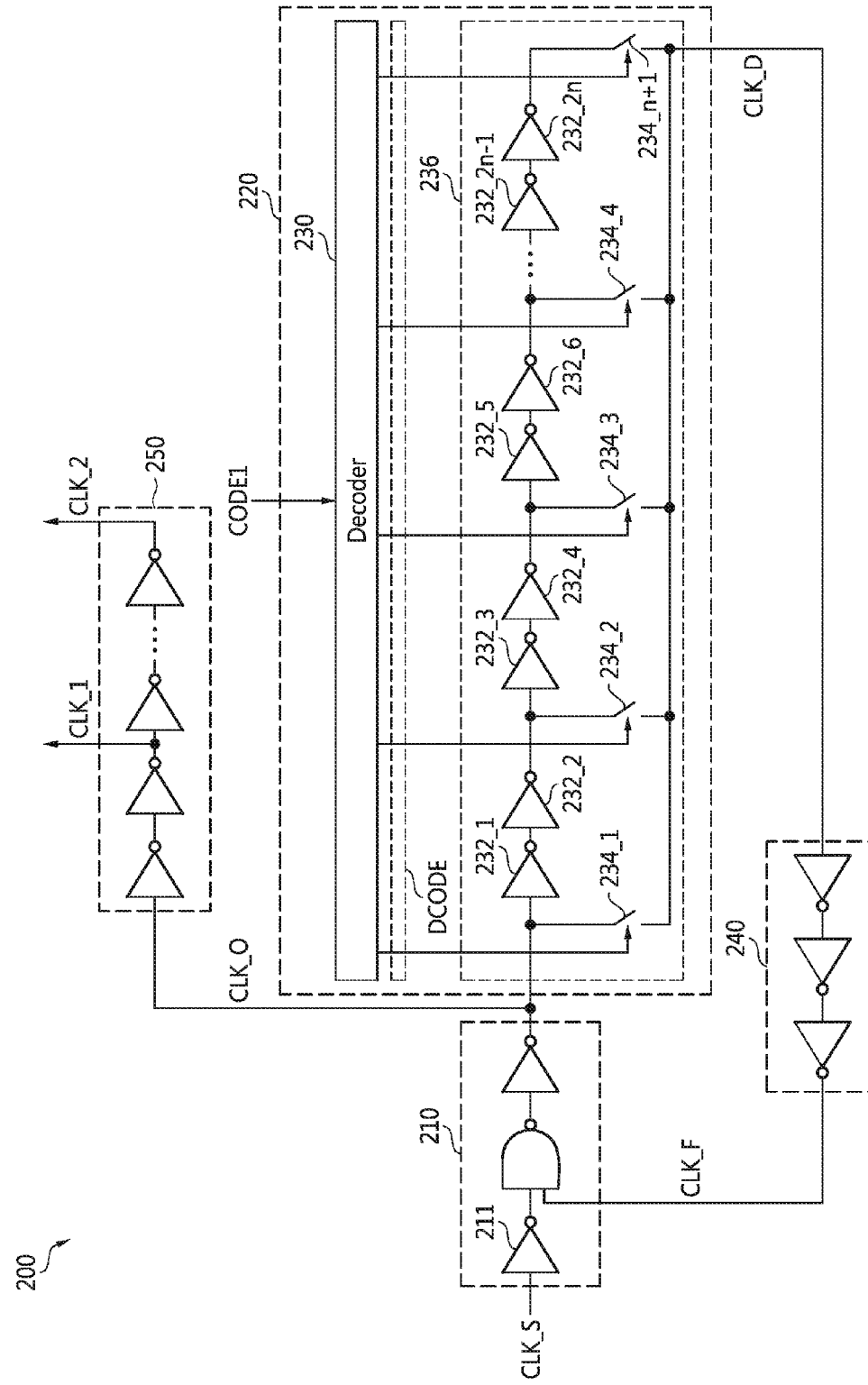
FIG. 3 is a circuit diagram illustrating a ring oscillator illustrated in FIG. 2.

FIG. 3 is a circuit diagram illustrating the ring oscillator 200 illustrated in FIG. 2. Referring to FIGS. 1 through 3, the ring oscillator 200 includes an output clock signal generation circuit 210, a delay adjustment circuit 220, a feedback circuit 240, and an output circuit 250.

The output clock signal generation circuit 210 receives the sampling clock signal CLK_S and a feedback clock signal CLK_F, and generates the output clock signal CLK_O using the sampling clock signal CLK_S and the feedback clock signal CLK_F. The output clock signal generation circuit 210 includes a plurality of inverters and a NAND gate. The NAND gate may perform a NAND operation on the sampling clock signal CLK_S and the feedback clock signal CLK_F, and may output an output signal corresponding to an operation result. The NAND gate may be replaced with a NOR gate and an inverter in other example embodiments.

The delay adjustment circuit 220 receives the output clock signal CLK_O and the first control code CODE1, may adjust the delay of the output clock signal CLK_O according to a logic value (e.g., logic 1 or logic 0) of each of the bits included in the first control code CODE1, and outputs a delay-adjusted clock signal CLK_D. The delay adjustment circuit 220 includes a decoder 230 and a delay circuit 236.

The decoder 230 may decode the first control code CODE1, and outputs a decoded control code DCODE to the delay circuit 236. The number of bits included in the first control code CODE1 may be the same as or different from the number of bits included in the decoded control code DCODE. The number of bits included in the decoded control code DCODE may be the same as the number of a plurality of switches 234_1 through 234_n+1 included in the delay circuit 236, where "n" is a natural number. The decoder 230 may be placed within the code generator 410.

The delay circuit 236 may generate a plurality of delayed clock signals having different delays (or phases) using the output clock signal CLK_O, and may output one among the delayed clock signals as the delay-adjusted clock signal CLK_D based on the decoded control code DCODE. The phase of the delay-adjusted clock signal CLK_D may be the same as that of the output clock signal CLK_O.

The delay circuit 236 includes a plurality of inverters 232_1 through 232_2n connected in series, and the plurality of switches 234_1 through 234_n+1. On/off of each of the switches 234_1 through 234_n+1 may be controlled according to the logic value of a corresponding one among the bits included in the decoded control code DCODE. The number of the switches 234_1 through 234_n+1 may be the same as or different from the number of the inverters 232_1 through 232_2n. The delay circuit 236 may be implemented as an inverter chain, a current controlled delay line, or a current starved delay line.

The feedback circuit 240 receives the delay-adjusted clock signal CLK_D, and generates the feedback clock signal CLK_F by delaying the delay-adjusted clock signal CLK_D. Although the feedback circuit 240 includes three inverters in the example embodiments illustrated in FIG. 3, the number of inverters included in the feedback circuit 240 may be changed according to design specification.

The output circuit 250 generates the first and second clock signals CLK_1 and CLK_2 having different delays (or phases) using the output clock signal CLK_O. The phase of the first clock signal CLK_1 may be the same as or different from the phase of the second clock signal CLK_2. The output circuit 250 includes a plurality of inverters. The number of inverters included in the output circuit 250 may be changed.

The number of inverters and NAND gates included in a loop formed by the output clock signal generation circuit 210, the delay circuit 236, and the feedback circuit 240 may be an odd number. In other words, the sum of the number of all inverters and NAND gates included in the output clock signal generation circuit 210 except for a first inverter 211, the number of the inverters 232_1 through 232_2n included in the delay circuit 236, and the number of the inverters included in the feedback circuit 240 may be an odd number.

Figure 4:
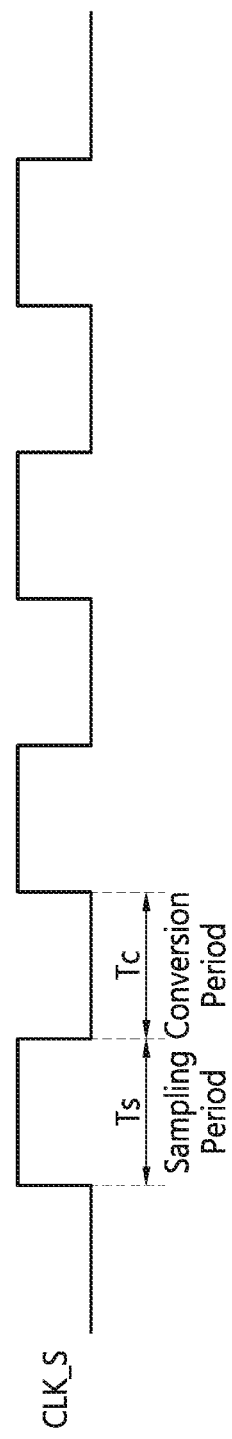
FIG. 4 is a diagram illustrating an operation of a sampling clock signal in each period, according to example embodiments.

FIG. 4 is a diagram illustrating an operation of the sampling clock signal CLK_S in each period, according to example embodiments. Referring to FIGS. 1 through 4, a sampling period Ts is defined as a period while the sampling clock signal CLK_S is at the high level. The input voltage Vin is sampled in the sampling period Ts. A conversion period Tc is defined as a period while the sampling clock signal CLK_S is at the low level. Analog-to-digital conversion of a sampled input voltage is performed in the conversion period Tc. It is assumed that the operations described above with reference to FIGS. 1 through 3 are performed in the conversion period Tc. Although the length of sampling period Ts is equal to the length of the conversion period Tc in the example embodiments illustrated in FIG. 4, they may be different from each other in other example embodiments. For instance, a ratio of the sampling period Ts to the conversion period Tc may be 1:3.

Figure 5:
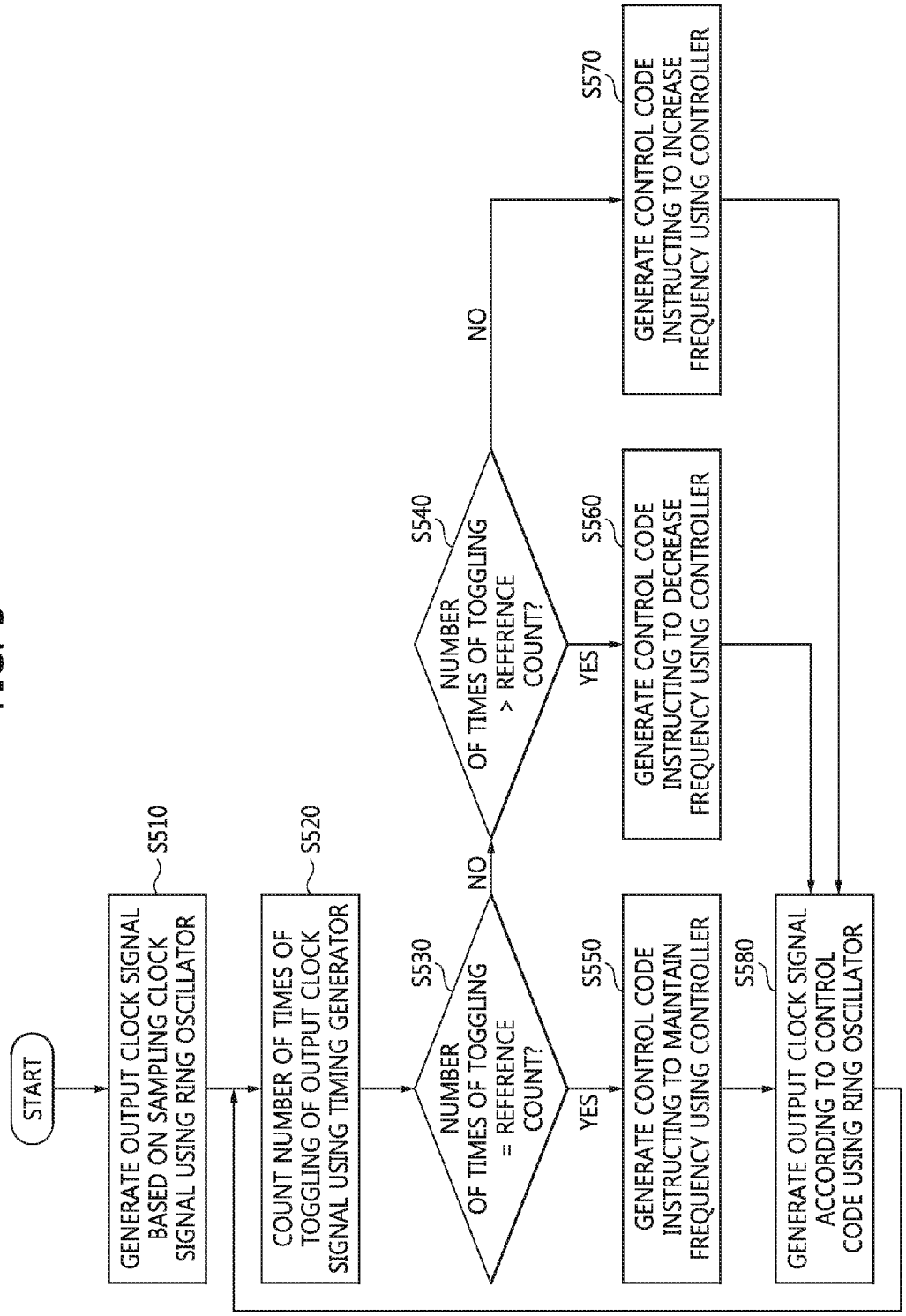
FIG. 5 is a flowchart illustrating an operation of the internal clock system illustrated in FIG. 1, according to example embodiments.

FIG. 5 is a flowchart illustrating an operation of the internal clock system 140 illustrated in FIG. 1, according to example embodiments. Referring to FIGS. 1 through 5, the input voltage Vin is sampled. In operation S510, the ring oscillator 200 generates the output clock signal CLK_O based on the sampling clock signal CLK_S.

In operation S520, the timing generator 300 counts the number of times of toggling of the output clock signal CLK_O during the conversion period Tc to generate the count value CNT. The timing generator 300 may output the count value CNT to the controller 400.

In operation S530, the controller 400 determines whether the count value CNT is equal to a reference count value. A reference count may be the number of times of clock toggling corresponding to the reference count value.

When the count value CNT is the same as the reference count value, in operation S550, the controller 400 generates the first control code CODE1 instructing to maintain the frequency of the output clock signal CLK_O of the ring oscillator 200, and may transmit the first control code CODE1 to the ring oscillator 200. When the count value CNT is not the same as the reference count value, in operation S540, the controller 400 determines whether the count value CNT is greater than the reference count value.

When the count value CNT is greater than the reference count value, in operation S560, the controller 400 generates the first control code CODE1 instructing to decrease the frequency of the output clock signal CLK_O of the ring oscillator 200, and may transmit the first control code CODE1 to the ring oscillator 200. When the count value CNT is less than the reference count value, in operation S570, the controller 400 generates the first control code CODE1 instructing to increase the frequency of the output clock signal CLK_O of the ring oscillator 200, and may transmit the first control code CODE1 to the ring oscillator 200.

In operation S580, the ring oscillator 200 changes the frequency of the output clock signal CLK_O based on the first control code CODE1, and generates the output clock signal CLK_O having a changed frequency. The output clock signal CLK_O having the changed frequency may be input to the timing generator 300, and then operation S520 may be repeated. The internal clock system 140 may repeat operations S520 through S580 until analog-to-digital conversion of the sampled input voltage ends.

Figure 6:
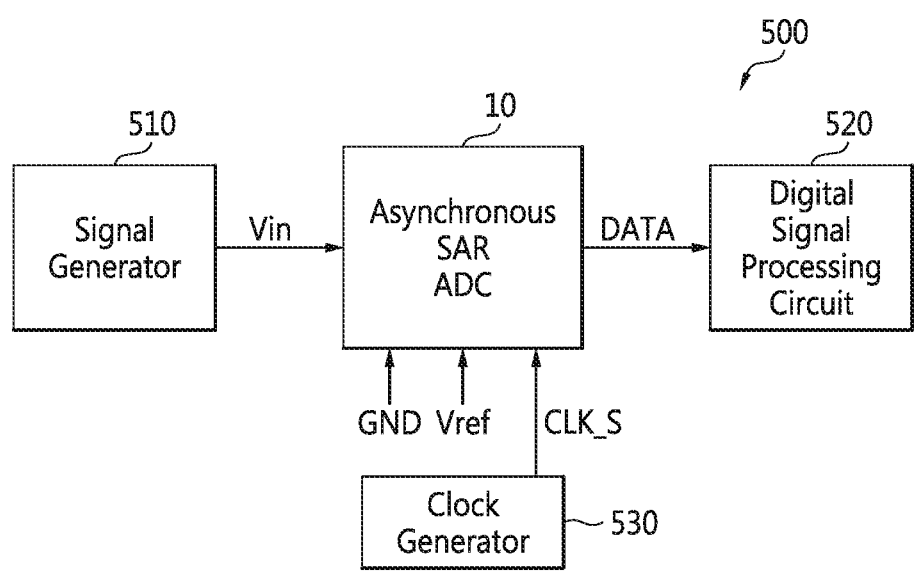
FIG. 6 is a block diagram illustrating a semiconductor device including the SAR ADC illustrated in FIG. 1, according to example embodiments.

FIG. 6 is a block diagram illustrating a semiconductor device 500 including the SAR ADC 10 illustrated in FIG. 1, according to example embodiments. Referring to FIGS. 1 through 6, the semiconductor device 500 includes the SAR ADC 10, a signal generator 510, a digital signal processing circuit 520, and a clock generator 530.

The semiconductor device 500 may perform analog-to-digital conversion using the SAR ADC 10, and may process the digital output signal DATA. The semiconductor device 500 may be implemented as an integrated circuit (IC), a central processing unit (CPU), a graphics processing unit (GPU), a system on chip (SoC), a processor, an application processor (AP), a modem chip, or a mobile device. The mobile device may be a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, or a drone.

The signal generator 510 transmits the analog input voltage Vin to the SAR ADC 10. The digital signal processing circuit 520 receives the digital output signal DATA from the SAR ADC 10, and may process the digital output signal DATA. The clock generator 530 provides the sampling clock signal CLK_S for the SAR ADC 10.

As described above, according to example embodiments, an asynchronous SAR ADC uses a ring oscillator, thereby continuously performing conversion even when a metastability problem occurs. The SAR ADC adjusts the delay of the ring oscillator, thereby reducing errors occurring due to process, voltage and temperature (PVT).

At least one among the components, elements, modules or units represented by a block as illustrated in FIGS. 1 to 2 and 6 may be embodied as various numbers of hardware, software and/or firmware structures that execute respective functions described above, according to the example embodiments. For example, at least one among these components, elements, modules or units may use a direct circuit structure, such as a memory, a processor, a logic circuit, a look-up table, etc. that may execute the respective functions through controls of one or more microprocessors or other control apparatuses. Also, at least one among these components, elements, modules or units may be embodied by a module, a program, or a part of code, which contains one or more executable instructions for performing specified logic functions, and executed by one or more microprocessors or other control apparatuses. Also, at least one among these components, elements, modules or units may further include or may be implemented by a processor such as a central processing unit (CPU) that performs the respective functions, a microprocessor, or the like. Two or more of these components, elements, modules or units may be combined into one single component, element, module or unit that performs all operations or functions of the combined two or more components, elements, modules or units. Also, at least part of functions of at least one among these components, elements, modules or units may be performed by another of these components, elements, modules or units. Further, communication between the components, elements, modules or units may be performed through the bus. Functional aspects of the above example embodiments may be implemented in algorithms that execute on one or more processors. Furthermore, the components, elements, modules or units represented by a block or processing steps may employ any number of related art techniques for electronics configuration, signal processing and/or control, data processing and the like.

Although a few example embodiments have been shown and described, it would be appreciated by those skilled in the art that changes may be made in the example embodiments without departing from the principles and spirit of the disclosure, the scope of which is defined in the claims and their equivalents.

What is claimed is:

1. A successive approximation register (SAR) analog-to-digital converter (ADC) comprising:
    a ring oscillator configured to determine a frequency based on a sampling clock signal and a first control code, and generate an output clock signal having the determined frequency; and
    a controller configured to generate the first control code based on a count value indicating a number of times of toggling the output clock signal,
    wherein the controller comprises:
        a code generator configured to generate a second control code based on the count value; and
        a switch control register configured to store the second control code, and output, to the ring oscillator, the first control code corresponding to the second control code.

2. The SAR ADC of claim 1, wherein the code generator is further configured to:
    determine whether the count value is greater than a reference count value;
    generate the second control code for controlling the frequency to be decreased, in response to the code generator determining that the count value is greater than the reference count value; and
    generate the second control code for controlling the frequency to be increased, in response to the code generator determining that the count value is less than the reference count value.

3. The SAR ADC of claim 1, wherein the ring oscillator comprises:
    an output clock signal generation circuit configured to generate the output clock signal based on the sampling clock signal and a feedback clock signal;
    a feedback circuit configured to generate the feedback clock signal; and
    a delay adjustment circuit configured to adjust a delay of the output clock signal based on the first control code, and output the delay-adjusted output clock signal to the feedback circuit.

4. The SAR ADC of claim 3, wherein the delay adjustment circuit comprises:
    a decoder configured to decode the first control code to generate a decoded control code; and
    a delay circuit configured to generate delayed clock signals having different delays based on the output clock signal, and output one among the delayed clock signals as the delay-adjusted output clock signal based on the decoded control code.

5. The SAR ADC of claim 4, wherein the delay circuit comprises one among an inverter chain, a current controlled delay line, and a current starved delay line.

6. The SAR ADC of claim 1, wherein the ring oscillator further comprises an output circuit configured to generate a first clock signal and a second clock signal having different delays, based on the output clock signal.

7. The SAR ADC of claim 6, further comprising:
    a digital-to-analog converter configured to sample an input voltage, generate a first reference voltage based on the sampled input voltage and voltages that are determined based on respective bits included in a reference voltage control code, and generate an analog output voltage based on the first reference voltage and the sampled input voltage;
    an amplifier configured to amplify the analog output voltage based on the first clock signal;

a comparator configured to compare an output voltage of the amplifier with a second reference voltage based on the second clock signal, and generate a comparison signal based on the comparison; and a SAR logic circuit configured to generate the reference voltage control code based on a timing information signal, and output the comparison signal.

8. The SAR ADC of claim 7, further comprising a digital logic circuit configured to:

determine which one among the bits included in the reference voltage control code is to be processed based on the count value; and generate the timing information signal based on the determination.

9. The SAR ADC of claim 1, further comprising a counter configured to count the number of times of toggling the output clock signal in a period to generate the count value.

10. A semiconductor device comprising:

a signal generator configured to generate an input voltage;

a successive approximation register (SAR) analog-to-digital converter (ADC) configured to convert the input voltage into a digital output signal based on a sampling clock signal; and a digital signal processing circuit configured to process the digital output signal, wherein the SAR ADC comprises:

a ring oscillator configured to determine a frequency based on a sampling clock signal and a first control code, and generate an output clock signal having the determined frequency; and a controller configured to generate the first control code based on the frequency of the output clock signal, wherein the ring oscillator comprises:

an output clock signal generation circuit configured to generate the output clock signal based on the sampling clock signal and a feedback clock signal;

a feedback circuit configured to generate the feedback clock signal; and a delay adjustment circuit configured to adjust a delay of the output clock signal based on the first control code, and output the delay-adjusted output clock signal to the feedback circuit.

11. The semiconductor device of claim 10, wherein the controller comprises:

a code generator configured to generate a second control code based on a count value; and a switch control register configured to store the second control code, and output, to the ring oscillator, the first control code corresponding to the second control code.

12. The semiconductor device of claim 11, wherein the code generator is further configured to:

determine whether the count value is greater than a reference count value;

generate the second control code for controlling the frequency to be decreased, in response to the code generator determining that the count value is greater than the reference count value; and generate the second control code for controlling the frequency to be increased, in response to the code generator determining that the count value is less than the reference count value.

13. The semiconductor device of claim 10, wherein the delay adjustment circuit comprises:

a decoder configured to decode the first control code to generate a decoded control code; and a delay circuit configured to generate delayed clock signals having different delays based on the output clock signal, and output one among the delayed clock signals as the delay-adjusted output clock signal based on the decoded control code.

14. The semiconductor device of claim 13, wherein a number of bits included in the first control code is less than a number of bits included in the decoded control code.

15. A successive approximation register (SAR) analog-to-digital converter (ADC) comprising:

a ring oscillator configured to generate an output clock signal based on a sampling clock signal;

a counter configured to counts a number of times of toggling the output clock signal in a period to generate a count value; and a controller configured to generate a control code for controlling a frequency of the output clock signal based on the count value, wherein the ring oscillator is further configured to generate the output clock signal having the controlled frequency based on the control code, and wherein the controller is further configured to:

determine whether the count value is equal to a reference count value;

generate a second control code for controlling the frequency to be maintained, in response to a code generator determining that the count value is equal to the reference count value;

generate the second control code for controlling the frequency to be decreased, in response to the code generator determining that the count value is greater than the reference count value; and generate the second control code for controlling the frequency to be increased, in response to the code generator determining that the count value is less than the reference count value.

16. The SAR ADC of claim 15, wherein the number of times of toggling the output clock signal is equal to a number of rising or falling edges of the output clock signal in a the period.

17. The SAR ADC of claim 15, further comprising:

a digital-to-analog converter configured to sample an input voltage, generate a first reference voltage based on the sampled input voltage and voltages that are determined based on respective bits included in a reference voltage control code, and generate an analog output voltage based on the first reference voltage and the sampled input voltage;

an amplifier configured to amplify the analog output voltage based on a first clock signal, the ring oscillator being further configured to determine the first clock signal based on the output clock signal;

a comparator configured to compare an output voltage of the amplifier with a second reference voltage based on a second clock signal, and generate a comparison signal based on the comparison, the ring oscillator being further configured to determine the second clock signal having a delay different than a delay of the first clock signal, based on the output clock signal; and a SAR logic circuit configured to generate the reference voltage control code based on a timing information signal, and output the comparison signal.

* * * * *